(12) United States Patent
Yasumoto et al.

(10) Patent No.: US 12,275,846 B2
(45) Date of Patent: Apr. 15, 2025

(54) RESIN COMPOSITION, PREPREG, FILM WITH RESIN, METAL FOIL WITH RESIN, METAL-CLAD LAMINATE, AND PRINTED WIRING BOARD

(71) Applicant: PANASONIC INTELLECTUAL PROPERTY MANAGEMENT CO., LTD., Osaka (JP)

(72) Inventors: Jun Yasumoto, Fukushima (JP); Rihoko Watanabe, Osaka (JP); Teppei Washio, Fukushima (JP); Hiroharu Inoue, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 195 days.

(21) Appl. No.: 18/012,176

(22) PCT Filed: Jun. 14, 2021

(86) PCT No.: PCT/JP2021/022470
§ 371 (c)(1),
(2) Date: Dec. 21, 2022

(87) PCT Pub. No.: WO2021/261308
PCT Pub. Date: Dec. 30, 2021

(65) Prior Publication Data
US 2023/0250281 A1     Aug. 10, 2023

(30) Foreign Application Priority Data

Jun. 24, 2020   (JP) ................... 2020-109132

(51) Int. Cl.
*H05K 1/03*       (2006.01)
*C08J 5/24*       (2006.01)
(Continued)

(52) U.S. Cl.
CPC .............. *C08L 79/08* (2013.01); *C08J 5/246* (2021.05); *C08J 7/0427* (2020.01);
(Continued)

(58) Field of Classification Search
CPC .................................................. H05K 1/0353
See application file for complete search history.

(56) References Cited

U.S. PATENT DOCUMENTS 6,622,370 B1 *   9/2003   Sherman ............... H05K 1/024
                                                       29/601
2015/0332806 A1   11/2015  Hayakawa et al.
(Continued)

FOREIGN PATENT DOCUMENTS

| CN | 102115540 | 7/2011 |
|----|-----------|--------|
| CN | 109810504 | 5/2019 |

(Continued)

OTHER PUBLICATIONS

Official Communication issued in International Patent Application No. PCT/JP2021/022468, dated Aug. 17, 2021.
(Continued)

*Primary Examiner* — Jeremy C Norris
(74) *Attorney, Agent, or Firm* — GREENBLUM & BERNSTEIN, P.L.C.

(57) ABSTRACT

A resin composition contains a curable resin. A minimum value (Min) of loss tangent (tan $\delta$=E"/E') of a cured product of the resin composition is equal to or greater than 0.04. The loss tangent is a ratio of a loss modulus (E") of the cured product of the resin composition to a storage modulus (E') thereof. The loss modulus (E"), the storage modulus (E'), and the loss tangent (tan $\delta$=E"/E') are obtained by dynamic mechanical analysis at a temperature equal to or higher than 100° C. and equal to or lower than 200° C.

13 Claims, 8 Drawing Sheets

(51) Int. Cl.
*C08J 7/04* (2020.01)
*C08L 79/08* (2006.01)

(52) U.S. Cl.
CPC ........ *H05K 1/0353* (2013.01); *C08J 2309/06* (2013.01); *C08J 2333/08* (2013.01); *C08J 2363/00* (2013.01); *C08J 2379/08* (2013.01); *C08L 2203/16* (2013.01); *C08L 2205/035* (2013.01)

(56) References Cited

U.S. PATENT DOCUMENTS

| | | |
|---|---|---|
| 2016/0366761 A1 | 12/2016 | Hoshi et al. |
| 2018/0222152 A1 | 8/2018 | Umeda et al. |
| 2020/0002365 A1 | 1/2020 | Zhang et al. |
| 2021/0214547 A1 | 7/2021 | Honda et al. |

FOREIGN PATENT DOCUMENTS

| | | |
|---|---|---|
| JP | 2007-191675 | 8/2007 |
| JP | 2014-133877 | 7/2014 |
| JP | 2016-131243 | 7/2016 |
| JP | 2016-196549 | 11/2016 |
| JP | 2017-2305 | 1/2017 |
| JP | 2018-44065 | 3/2018 |
| JP | 2018-83893 | 5/2018 |
| JP | 2019-44128 | 3/2019 |
| JP | 2019-173010 | 10/2019 |
| JP | 2020-2217 | 1/2020 |
| JP | 2020-33472 | 3/2020 |
| WO | 2017/017923 | 2/2017 |
| WO | 2018/051715 | 3/2018 |
| WO | 2019/230945 | 12/2019 |

OTHER PUBLICATIONS

Official Communication issued in International Patent Application No. PCT/JP2021/022470, dated Aug. 17, 2021.
Official Communication issued in International Patent Application No. PCT/JP2021/022467, dated Aug. 10, 2021.

\* cited by examiner

RESIN COMPOSITION, PREPREG, FILM WITH RESIN, METAL FOIL WITH RESIN, METAL-CLAD LAMINATE, AND PRINTED WIRING BOARD

CROSS-REFERENCE TO RELATED APPLICATIONS

This application is a National Stage of International Application No. PCT/JP2021/022470 filed Jun. 14, 2021, which claims priority to Japanese Patent Application No. 2020-109132 filed Jun. 24, 2020, the contents of each of the above-identified applications are incorporated herein by reference in their entirety.

TECHNICAL FIELD

The present disclosure generally relates to a resin composition, a prepreg, a film with resin, a sheet of metal foil with resin, a metal-clad laminate, and a printed wiring board. More particularly, the present disclosure relates to a resin composition containing a curable resin and a prepreg, a film with resin, a sheet of metal foil with resin, a metal-clad laminate, and a printed wiring board, all of which use such a resin composition.

BACKGROUND ART

Research for reducing the warpage of a board material has been carried out in the art to increase the mounting reliability of semiconductor packages (PKG). An approach for increasing the rigidity of the board material and lowering the coefficient of thermal expansion (CTE) thereof is one of the results of such research. This approach is based on an idea that a mismatch in CTE between the board and a semiconductor chip to be mounted on the board is canceled by making the CTE of the board closer to the CTE of the semiconductor chip.

However, remarkable development has recently been made in the field of semiconductor technologies. Therefore, chances are that the structure of semiconductor packages will change significantly in the future. If that happens, the approach based on such an idea could no longer be applicable to the semiconductor packages with the significantly changed structure. That is to say, it must be said that such an approach lacks versatility.

To overcome such a problem, another approach, different from the idea described above, has also been proposed. For example, Patent Literature 1 discloses a prepreg that adopts a different approach from the known one. The prepreg of Patent Literature 1 is made up of a resin composition and a woven fabric base member. The resin composition contains an epoxy resin (A) or any other resin having a naphthalene skeleton, a high-molecular-weight substance (B) having a particular structure, and an inorganic filler (C).

The prepreg of Patent Literature 1 is a highly versatile board material. Nevertheless, the prepreg still has room for improvement in terms of warpage reduction and heat resistance.

CITATION LIST

Patent Literature

Patent Literature 1: JP 2017-002305 A

SUMMARY OF INVENTION

An object of the present disclosure is to provide a resin composition, a prepreg, a film with resin, a sheet of metal foil with resin, a metal-clad laminate, and a printed wiring board, all of which contribute to manufacturing a board with reduced warpage and improved heat resistance.

A resin composition according to an aspect of the present disclosure contains a curable resin. A minimum value of loss tangent (tan $\delta$=E"/E') of a cured product of the resin composition is equal to or greater than 0.04. The loss tangent is a ratio of a loss modulus (E") of the cured product of the resin composition to a storage modulus (E') thereof. The loss modulus (E"), the storage modulus (E'), and the loss tangent (tan $\delta$=E"/E') are obtained by dynamic mechanical analysis at a temperature equal to or higher than 100° C. and equal to or lower than 200° C.

A prepreg according to another aspect of the present disclosure includes: a base member; and a resin layer containing either the resin composition described above or a semi-cured product of the resin composition. The resin composition or the semi-cured product of the resin composition is impregnated into the base member.

A film with resin according to still another aspect of the present disclosure includes: a resin layer containing either the resin composition described above or a semi-cured product of the resin composition; and a supporting film supporting the resin layer.

A sheet of metal foil with resin according to yet another aspect of the present disclosure includes: a resin layer containing either the resin composition described above or a semi-cured product of the resin composition; and a sheet of metal foil bonded to the resin layer.

A metal-clad laminate according to yet another aspect of the present disclosure includes: an insulating layer containing either a cured product of the resin composition described above or a cured product of the prepreg described above; and a metal layer bonded to the insulating layer.

A printed wiring board according to yet another aspect of the present disclosure includes: an insulating layer containing either a cured product of the resin composition described above or a cured product of the prepreg described above; and conductor wiring formed on the insulating layer.

DESCRIPTION OF EMBODIMENTS

1. Overview

Figure 1:
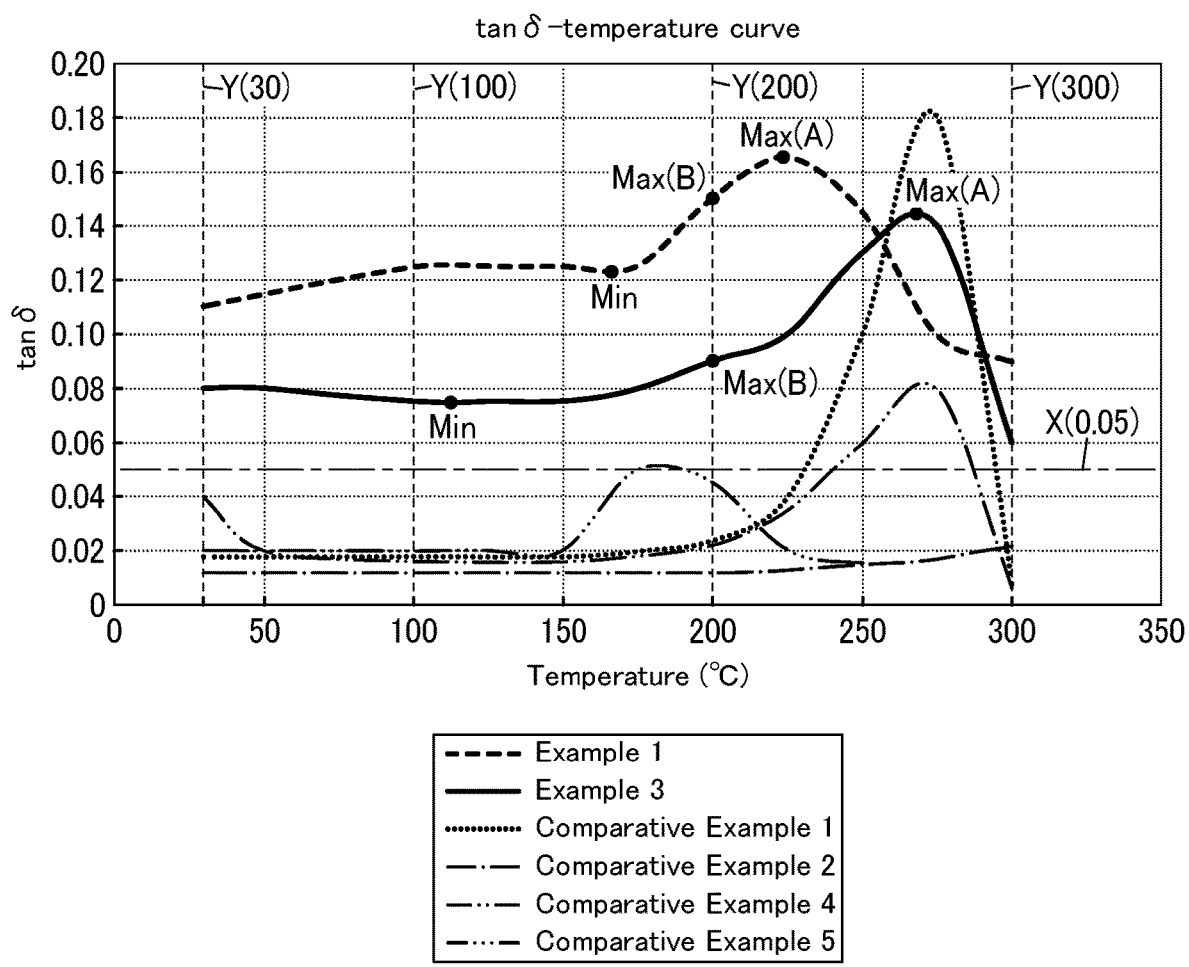
FIG. 1 shows tan $\delta$-temperature curves representing temperature dependence of loss tangent (tan $\delta$) according to specific examples and comparative examples.

A resin composition according to an exemplary embodiment contains a curable resin and may be used as a board material. Examples of applications of the board material may include, without limitation, a prepreg 1, a film 2 with resin, a sheet of metal foil 3 with resin, a metal-clad laminate 4, and a printed wiring board 5 (see FIGS. 2-7B).

The present inventors discovered, while carrying out research on the warpage of boards, that the boards tended to absorb the stress more easily by adjusting the loss tangent (tan δ) of the board materials to a higher value than known ones. In other words, the present inventors discovered that stress absorption ability could be expressed, and the warpage of the boards could be reduced by increasing tan δ. In addition, the present inventors also discovered that the heat resistance could also be improved in that case.

Specifically, the minimum value (Min) of the loss tangent (tan δ) of a cured product of a resin composition according to this embodiment as measured at a temperature equal to or higher than 100° C. and equal to or lower than 200° C. is equal to or greater than 0.04. This point will be described with reference to the accompanying drawings. FIG. 1 shows tan δ-temperature curves showing temperature dependence of loss tangent (tan δ). In FIG. 1, first and third examples satisfy the condition for a resin composition according to this embodiment. This makes it easier for the board to absorb the stress. Thus, the first and third examples enable manufacturing a board with its warpage reduced and its heat resistance improved (see Table 1).

In contrast, none of first, second, and fifth comparative examples satisfies the condition for the resin composition according to this embodiment. This makes it more difficult for the board to absorb the stress. Thus, in the first, second, and fifth comparative examples, the board tends to have increased warpage.

On the other hand, the fourth comparative example also fails to satisfy the condition for resin composition according to this embodiment. According to the fourth comparative example, the warpage of the board is not so significant, but the heat resistance is poor (see Table 2). The details of the respective examples and comparative examples will be described later (for further details, see the "Examples" section).

2. Details

Next, a resin composition according to this embodiment will be described in detail. After that, a prepreg 1, a film 2 with resin, a sheet of metal foil 3 with resin, a metal-clad laminate 4, a printed wiring board 5, and a semiconductor package 100 according to this embodiment will be described in detail with reference to the accompanying drawings. In some of the drawings, arrows indicating X, Y, and Z directions, which intersect at right angles with each other, are shown for the sake of convenience of description. Note that those arrows are insubstantial ones.

(1) Resin Composition

<Viscoelastic Property>

A resin composition according to this embodiment exhibits the following viscoelastic property. Specifically, one of the features of the resin composition according to this embodiment is that its loss tangent (tan δ=E"/E') is higher than that of a known material. Specifically, the minimum value (Min) of the loss tangent of a cured product of the resin composition at a temperature equal to or higher than 100° C. and equal to or lower than 200° C. is equal to or greater than 0.04 (see the tan δ-temperature curves of the first and third examples shown in FIG. 1).

In this case, the loss tangent (tan δ) is the ratio (E"/E') of the loss modulus (E") to the storage modulus (E'). The storage modulus (E') refers to the energy produced inside an object (cured product) by strain. On the other hand, the loss modulus (E") refers to the thermal energy produced in the object by strain. Making the minimum value (Min) of the loss tangent at a temperature equal to or higher than 100° C. and equal to or lower than 200° C. equal to or greater than 0.04 as described above makes it easier to dissipate, as thermal energy, the stress caused inside the cured product due to friction between molecules inside the cured product. Note that the storage modulus (E'), the loss modulus (E"), and the loss tangent (tan δ=E"/E') are obtained by dynamic mechanical analysis (DMA).

Another feature of the resin composition according to this embodiment is that the tan δ-temperature curves each have a baseline but have no peaks within the range from 100° C. to 200° C. (see the first and third examples shown in FIG. 1). In other words, the cured product of the resin composition according to this embodiment has no glass transition temperature (Tg) within the range from 100° C. to 200° C. In FIG. 1, the range from 100° C. to 200° C. is a range interposed between two axes of ordinates Y(100) and Y(200), where Y(100) is an axis of ordinates indicating the 100° C. position and Y(200) is an axis of ordinates indicating the 200° C. position. On the other hand, referring to FIG. 1, the fifth comparative example has a peak within the range from 100° C. to 200° C.

As used herein, the "baseline" refers to a curved portion of a temperature range of a sample in which the loss tangent hardly changes. In other words, the baseline refers to a substantially flat linear portion of the tan δ-temperature curve within the range from 100° C. to 200° C. The peak as used herein refers to a portion of a tan δ-temperature curve between a point where the curve leaves the baseline and a point where the curve returns to the baseline.

Still another feature of the resin composition according to this embodiment is that the baselines of the tan δ-temperature curves are located at higher levels than the baselines of the tan δ-temperature curves of an existent material. In FIG.

1, the baselines of the tan δ-temperature curves of the first and third examples are located at levels higher than the axis of abscissas X(0.05), while the baselines of the tan δ-temperature curves of the first, second, fourth, and fifth comparative examples are located at levels lower than the axis of abscissas X(0.05). Note that X(0.05) is an axis of abscissas indicating a position where the loss tangent (tan δ) is 0.05.

The resin composition according to this embodiment exhibits such a viscoelastic property, thus allowing the board to absorb stress more easily. That is to say, when deformation (strain) is caused in the board, the viscous property of the board transforms the dynamic energy into thermal energy, which allows the board to absorb the stress. Thus, the resin composition according to this embodiment enables manufacturing a board with the warpage reduced.

The resin composition according to this embodiment preferably exhibits the following viscoelastic property. Specifically, as indicated by the tan δ-temperature curves of the first and third examples shown in FIG. 1, the Max (B)/Max (A) ratio is preferably less than one. This enables further reducing the warpage of the board.

In this case, Max (B) indicates the maximum value of the loss tangent of the cured product of the resin composition at a temperature equal to or higher than 100° C. and equal to or lower than 200° C. Max (A) indicates the maximum value of the loss tangent of the cured product of the resin composition at a temperature equal to or higher than 30° C. and lower than 100° C. and at a temperature higher than 200° C. and equal to or lower than 300° C. In FIG. 1, the range of the temperatures equal to or higher than 30° C. and lower than 100° C. is a range interposed between two axes of ordinates Y(30) and Y(100), where Y(30) is an axis of ordinates indicating the 30° C. position. On the other hand, the range of the temperatures higher than 200° C. and equal to or lower than 300° C. is a range interposed between two axes of ordinates Y(200) and Y(300), where Y(300) is an axis of ordinates indicating the 300° C. position.

The maximum value (Max (A)) of the loss tangent of the first and third examples shown in FIG. 1 is not located within the range of the temperatures equal to or higher than 30° C. and lower than 100° C. but is located within the range of the temperatures higher than 200° C. and equal to or lower than 300° C. Although not shown in FIG. 1, the maximum value (Max (A)) of the loss tangent may be located within the range of the temperatures equal to or higher than 30° C. and lower than 100° C. and may not be located within the range of the temperatures higher than 200° C. and equal to or lower than 300° C. Also, the maximum value (Max (A)) of the loss tangent within the range of the temperatures equal to or higher than 30° C. and lower than 100° C. may be the same as the maximum value (Max (A)) within the range of the temperatures higher than 200° C. and equal to or lower than 300° C.

The present inventors further carried on the research and development to identify constituent components of a resin composition that would exhibit such a viscoelastic property. Specifically, the resin composition according to this embodiment contains a curable resin. The resin composition preferably further contains a styrene copolymer (C). More preferably, the resin composition further contains an inorganic filler (D). The resin composition may further contain other components (E) as well.

The curable resin preferably contains a long-chain-containing compound (A1). The curable resin more preferably further contains a no-long-chain-containing compound (A2). The curable resin even more preferably contains a resin component (B). The resin component (B) is a resin component other than the long-chain-containing compound (A1), the no-long-chain-containing compound (A2), and the styrene copolymer (C). These constituent components of the resin composition will be described one by one.

<Curable Resin>

<<Long-Chain-Containing Compound (A1)>>

The long-chain-containing compound is a compound including a long-chain hydrocarbon group and a first functional group.

The long-chain hydrocarbon group has an alkyl group, of which the carbon number is equal to or greater than six, and/or an alkylene group, of which the carbon number is equal to or greater than six. In other words, the long-chain hydrocarbon group includes at least one of the alkyl group, of which the carbon number is equal to or greater than six, or the alkylene group, of which the carbon number is equal to or greater than six. The upper limit value of the carbon number of the alkyl group is not limited to any particular value but may be 100, for example. The upper limit value of the carbon number of the alkylene group is not limited to any particular value but may be 100, for example. As can be seen, the long-chain-containing compound (A1) includes a long-chain hydrocarbon group having as long a chain as C6 or more, and therefore, is likely to increase not only the loss tangent (tan δ) of the board but also the heat resistance of the board as well.

On the other hand, the first functional group includes at least one selected from the group consisting of an epoxy group, a maleimide group, an imide group, and a hydroxyl group.

The long-chain-containing compound (A1) preferably includes at least one selected from the group consisting of a maleimide compound (A3) expressed by the following formula (a3), a maleimide compound (A4) expressed by the following formula (a4), and a maleimide compound (A5) expressed by the following formula (a5). Adding such a maleimide compound (A3), (A4), or (A5) to the resin composition enables increasing the loss tangent (tan δ) of the board:

equal to or greater than 400 g/eq. This enables further reducing the warpage of the board. The upper limit value of the maleimide group equivalent is preferably equal to or less than 3000 g/eq and more preferably equal to or less than 2000 g/eq. Note that the maleimide group equivalent is a numerical value calculated by dividing the molecular weight

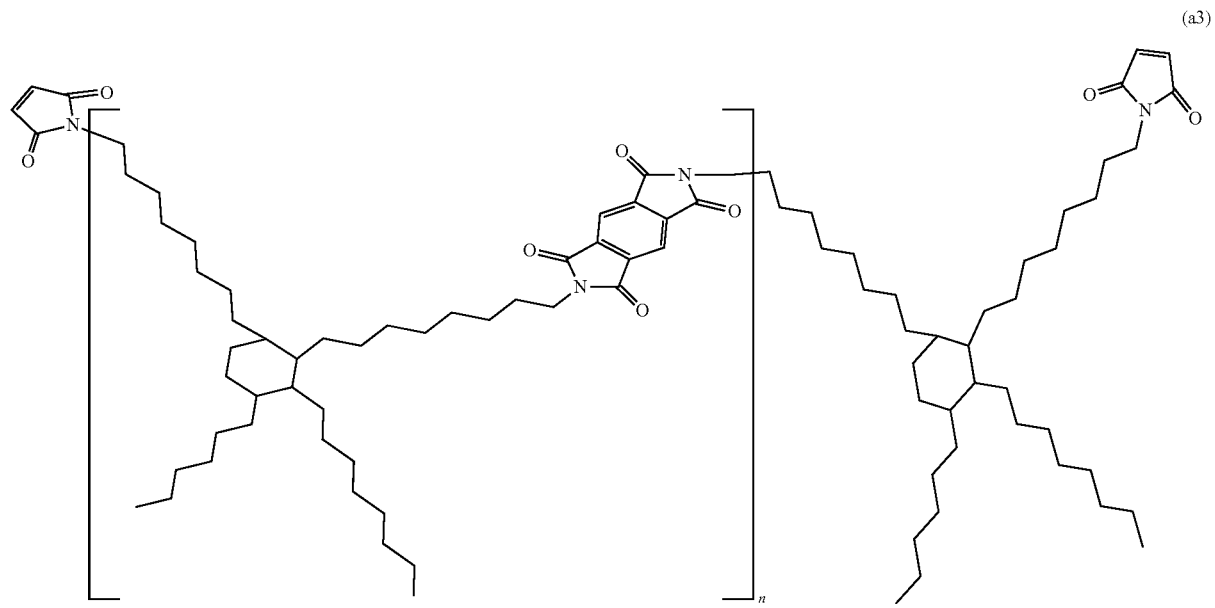

(a3)

where n is an integer falling within the range from 1 to 10.

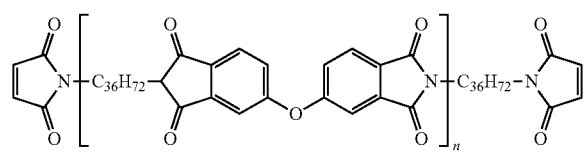

(a4)

where n is an integer falling within the range from 1 to 10.

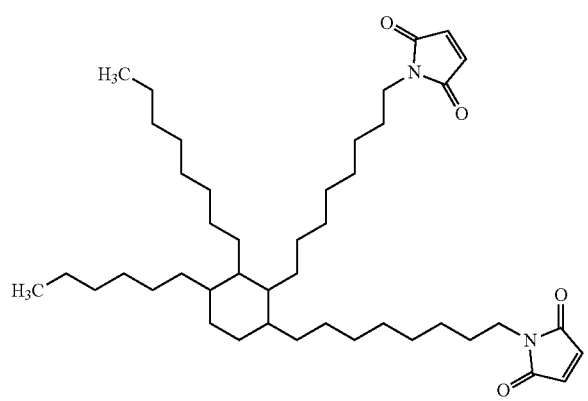

(a5)

The long-chain-containing compound (A1) is preferably a maleimide compound with a maleimide group equivalent of the maleimide compound by the number of maleimide groups that the maleimide compound has. That is to say, the maleimide group equivalent is a molecular weight per maleimide group.

The content of the long-chain-containing compound (A1) is preferably equal to or greater than 30 parts by mass and equal to or less than 75 parts by mass with respect to 100 parts by mass in total of the curable resin and the styrene copolymer (C). This enables further reducing the warpage of the board.

<<No-Long-Chain-Containing Compound (A2)>>

The no-long-chain-containing compound (A2) is a compound having no long-chain hydrocarbon group but having a second functional group.

The long-chain hydrocarbon group is as described above. As can be seen, the no-long-chain-containing compound (A2) has no long-chain hydrocarbon group having as long a chain as C6 or more.

On the other hand, the second functional group includes at least one selected from the group consisting of an epoxy group, a maleimide group, an imide group, and a hydroxyl group. That is to say, the second functional group of the no-long-chain-containing compound (A2) and the first functional group of the long-chain-containing compound (A1) are selected from the same group of functional groups. The second functional group may be the same as, or different from, the first functional group.

Note that if the second functional group of the no-long-chain-containing compound (A2) is different from the first functional group of the long-chain-containing compound (A1), these two functional groups are not easily compatible with each other but are likely to cause phase separation. This makes it easier to maintain the loss tangent of the cured product of the resin composition within a predetermined temperature range (e.g., equal to or higher than 100° C. and equal to or lower than 200° C.).

The no-long-chain-containing compound (A2) is preferably a maleimide compound, of which the maleimide group equivalent is less than 400 g/eq. This enables increasing the glass transition temperature (Tg) of the board. Increasing Tg of the board may reduce the chances of causing cracks in the board and increase the reliability of interlevel connection. That is to say, this may reduce the chances of causing cracks in a board such as a multilayer printed wiring board even if stress is applied to the board in a thermal shock test, for example, thus reducing an increase in the resistance value of via holes and through holes. This may increase the reliability of interlevel connection. In recent years, in particular, as the wiring has been laid out more and more densely with its feature size further reduced, the diameters of the via holes and through holes have been further reduced. Therefore, it is effective to increase Tg of the board to deal with circumstances such as these. The lower limit value of the maleimide group equivalent is preferably equal to or greater than 150 g/eq and more preferably equal to or greater than 200 g/eq.

The no-long-chain-containing compound (A2), of which the maleimide group equivalent is less than 400 g/eq, may, but does not have to, include a maleimide compound (A7) expressed by the following formula (a7), for example. The maleimide compound (A7) is 3,3'-dimethyl-5,5'-diethyl-4,4'-diphenylmethane bismaleimide.

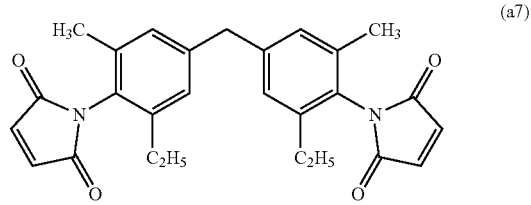 [SMILES: CCc1cc(Cc2cc(C)c(N3C(=O)C=CC3=O)c(CC)c2)cc(C)c1N1C(=O)C=CC1=O]

(a7)

If the curable resin includes both the long-chain-containing compound (A1) and the no-long-chain-containing compound (A2), the content of the no-long-chain-containing compound (A2) is preferably equal to or greater than 5 parts by mass and equal to or less than 50 parts by mass, and more preferably equal to or greater than 10 parts by mass and equal to or less than 40 parts by mass, with respect to 100 parts by mass in total of the long-chain-containing compound (A1) and the no-long-chain-containing compound (A2).

<<Resin Component (B)>>

The curable resin preferably further contains a resin component (B). The resin component (B) herein refers to resin components other than the long-chain-containing compound (A1), the no-long-chain-containing compound (A2), and the styrene copolymer (C).

Adding at least the long-chain-containing compound (A1) and the resin component (B) to the resin composition enables increasing the loss tangent of the cured product of the resin composition. For example, if the curable resin includes both the long-chain-containing compound (A1) and the no-long-chain-containing compound (A2) and the long-chain-containing compound (A1) and the no-long-chain-containing compound (A2) are both maleimide compounds, then the long-chain-containing compound (A1) and the no-long-chain-containing compound (A2) will cause phase separation, because the former has a long-chain hydrocarbon group and the latter has no long-chain hydrocarbon group, but may still react with each other. This still enables adjusting the loss tangent of the cured product to a value higher than the known one. If the reaction may be reduced with the phase separation state maintained, then the loss tangent of the cured product may be adjusted to an even higher value. The resin component (B) causes phase separation with respect to, and is unlikely to react with, at least the long-chain-containing compound (A1). Thus, the long-chain-containing compound (A1) and the resin component (B) are preferably contained in the resin composition. In that case, the no-long-chain-containing compound (A2) may be further contained in the resin composition.

The resin component (B) preferably has a glass transition temperature (Tg) equal to or higher than 200° C. The resin component (B) is more preferably incompatible, or unlikely to be compatible, with at least one of the long-chain-containing compound (A1), the no-long-chain-containing compound (A2), or the styrene copolymer (C). If the resin composition is likely to cause phase separation in this manner, then the tan δ-temperature curves may have a baseline in the range of temperatures equal to or higher than 100° C. and equal to or lower than 200° C. Conversely, if those components of the resin composition are easily compatible, then the tan δ-temperature curves may have a sharp peak within the range of temperatures equal to or higher than 100° C. and equal to or lower than 200° C.

The resin component (B) preferably includes at least one selected from the group consisting of epoxy compounds, phenolic compounds, polyphenylene ether compounds, modified polyphenylene ether compounds each having a reactive unsaturated group, benzoxazine compounds, radically polymerizable compounds each having a polymerizable unsaturated group, cyanate ester compounds, and amine compounds. This may impart a property unique to each of the resin components (B) to the resin composition. For example, this may improve the desmear resistance and the electrical characteristics. Particularly if the long-chain-containing compound (A1) includes a maleimide compound, then the resin component (B) preferably includes an epoxy compound.

The epoxy compound herein refers to a compound having at least one epoxy group (preferably two or more epoxy groups) per molecule. Specific examples of the epoxy compounds include, without limitation, dicyclopentadiene epoxy resins, naphthalene epoxy resins, biphenyl epoxy resins, and mesogen skeleton epoxy resins. The mesogen skeleton epoxy resin is an epoxy resin having at least one mesogen group per molecule. The mesogen group has a rigid structure and is the smallest unit structure that may form a liquid crystal structure. Examples of the mesogen group include, without limitation, a biphenyl structure and a phenylbenzoate structure.

The epoxy compound preferably has an epoxy equivalent equal to or greater than 200 g/eq and equal to or less than 350 g/eq. This enables increasing the glass transition temperature (Tg) of the board. As described above, increasing Tg of the board may reduce the chances of causing cracks in the board and increase the reliability of interlevel connection.

The phenolic compound is a compound produced by polymerizing a phenol and formaldehyde with an acidic catalyst or a basic catalyst. The phenolic compound may be, but does not have to be, phenol novolac, for example.

If the curable resin further contains the resin component (B), the content of the resin component (B) is preferably equal to or greater than 5 parts by mass and equal to or less than 55 parts by mass, and more preferably equal to or greater than 10 parts by mass and equal to or less than 50 parts by mass, with respect to 100 parts by mass in total of the curable resin and the styrene copolymer (C).

<Styrene Copolymer (C)>

The resin composition preferably further contains a styrene copolymer (C). This enables further reducing the warpage of the board.

The styrene copolymer (C) has at least one type of structure derived from a styrene compound and/or a styrene derivative. Examples of the styrene compound and/or styrene derivative include, without limitation, styrene, α-methyl styrene, p-methyl styrene, a compound in which some of hydrogen atoms of these aromatic rings are replaced with an alkyl group, and polymers thereof. The styrene copolymer (C) may further have a structure derived from a conjugated diene-based compound.

The styrene copolymer (C) may be a non-hydrogenated product or a hydrogenated product, whichever is appropriate. The non-hydrogenated product herein refers to a non-hydrogenated substance. The hydrogenated product herein refers to a hydrogenated substance. The weight average molecular weight of the styrene copolymer (C) is preferably equal to or greater than 10,000 and equal to or less than 150,000. Adding such a styrene copolymer (C) to the resin composition enables further reducing the warpage of the board. Making the weight average molecular weight of the styrene copolymer (C) equal to or greater than 10,000 may check a decline in the desmear resistance. The desmear resistance herein refers to the ability to sufficiently, but not excessively, remove the smear that is resin smear remaining even after the board has been subjected to hole cutting. On the other hand, making the weight average molecular weight of the styrene copolymer (C) equal to or less than 150,000 may check a decline in flame resistance.

The styrene copolymer (C) preferably includes at least one selected from the group consisting of a methylstyrene (ethylene/butylene) methylstyrene copolymer, a methylstyrene (ethylene-ethylene/propylene) methylstyrene copolymer, a styrene-isoprene copolymer, a styrene-isoprene-styrene copolymer, a styrene (ethylene/butylene) styrene copolymer, a styrene (ethylene-ethylene/propylene) styrene copolymer, and hydrogenated products thereof. Adding such a styrene copolymer (C) to the resin composition enables further reducing the warpage of the board.

If the resin composition further contains the styrene copolymer (C), the content of the styrene copolymer (C) is preferably equal to or greater than 1 part by mass and equal to or less than 40 parts by mass, and more preferably equal to or greater than 10 parts by mass and equal to or less than 35 parts by mass, with respect to 100 parts by mass in total of the curable resin and the styrene copolymer (C). This enables further reducing the warpage of the board.

<Inorganic Filler (D)>

The resin composition preferably further contains an inorganic filler (D). This enables reducing the coefficient of thermal expansion (linear expansivity) of the board.

The inorganic filler (D) preferably contains at least one selected from the group consisting of metal oxides, metal hydroxides, talc, aluminum borate, barium sulfate, calcium carbonate, and zinc molybdate. Examples of the metal oxides include, without limitation, silica, alumina, titanium oxide, and mica. Examples of the metal hydroxides include, without limitation, aluminum hydroxide and magnesium hydroxide.

The inorganic filler (D) is preferably surface-treated with a surface treatment agent. This improves the wettability of the inorganic filler (D) with the long-chain-containing compound (A1), the no-long-chain-containing compound (A2), the resin component (B), and the styrene copolymer (C) and thereby improves the dispersibility of the inorganic filler (D). Examples of the surface treatment agents include, without limitation, silane coupling agents, titanate coupling agents, aliphatic acid, and surfactants. The silane coupling agent preferably includes at least one functional group selected from the group consisting of a vinyl group, an epoxy group, a styryl group, a methacrylic group, an acrylic group, an amino group, an isocyanurate group, a ureido group, a mercapto group, an isocyanate group, and an acid anhydride group.

The inorganic filler (D) preferably has a spherical shape. This may increase the flowability of the resin composition during the molding process.

The mean particle size of the inorganic filler (D) is preferably equal to or greater than 0.01 μm and equal to or less than 50 μm and more preferably equal to or greater than 0.05 μm and equal to or less than 20 μm. Note that the mean particle size refers herein to a particle size at an integrated value of 50% in a particle size distribution obtained by laser diffraction and scattering method.

If the resin composition further contains the inorganic filler (D), the content of the inorganic filler (D) is preferably equal to or greater than 20 parts by mass and equal to or less than 200 parts by mass, and more preferably equal to or greater than 50 parts by mass and equal to or less than 150 parts by mass, with respect to 100 parts by mass in total of the curable resin and the styrene copolymer (C).

<Other Components (E)>

The resin composition may further contain other components (E). Examples of the other components (E) include, without limitation, catalytic curing agents, cross-linking agents, reaction initiators, resin modifiers, antifoaming agents, heat stabilizers, antistatic agents, ultraviolet absorbers, dyes, pigments, lubricants, dispersants such as a wet dispersant, and leveling agents. The catalytic curing agents include an imidazole compound such as 2-ethyl-4-methylimidazole. The reaction initiators include organic peroxides such as α, α'-di (t-butylperoxy) diisopropyl benzene. The content of the other components (E) is not limited to any particular value unless the advantages of this embodiment are reduced.

<Form>

The resin composition may have any form without limitation. That is to say, the resin composition may be in liquid form or in solid form, whichever is appropriate. The liquid form includes a varnish form. A varnish may be prepared by mixing the resin composition with a solvent and stirring up the mixture. Examples of the solvents include, without limitation, toluene, methyl ethyl ketone, cyclohexanone, and propylene glycol monomethyl ether acetate.

(2) Prepreg

Figure 2:
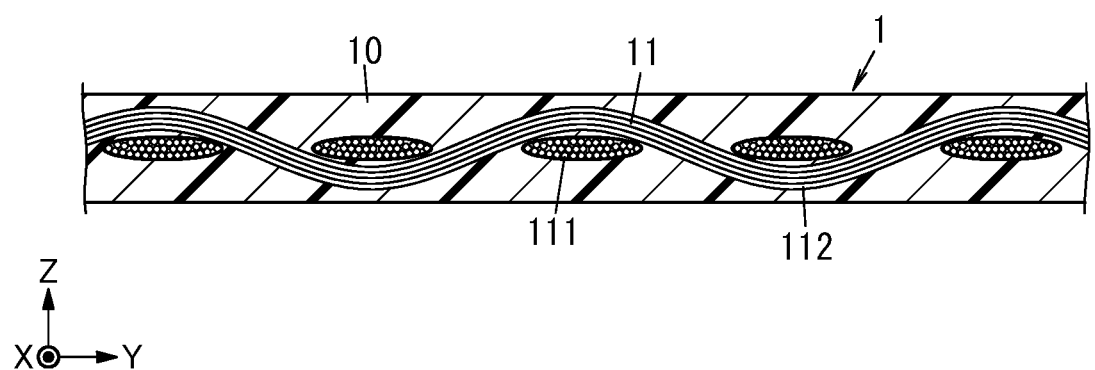
FIG. 2 is a schematic cross-sectional view illustrating a prepreg according to an exemplary embodiment of the present disclosure.

FIG. 2 illustrates a prepreg 1 according to this embodiment. The prepreg 1 has the shape of a sheet or a film as a whole. That is to say, the prepreg 1 extends in the X direction and the Y direction. The prepreg 1 may be used as a material for the metal-clad laminate 4, as a material for the printed wiring board 5, and to make a printed wiring board 5 with multiple levels (by buildup process). When heated or irradiated with light (e.g., an ultraviolet ray), the prepreg 1 is cured to turn into a cured product. The cured product of the prepreg 1 may form an insulating layer 40 of the metal-clad laminate 4 or an insulating layer 50 of the printed wiring board 5 (refer to FIGS. 6-7B).

The prepreg 1 includes: a base member 11; and a resin layer 10 containing either a resin composition or a semi-cured product of the resin composition, each of which is impregnated into the base member 11. A sheet of the prepreg 1 includes at least one base member 11.

A material for the base member 11 is not limited to any particular one but may be, for example, a woven fabric or a nonwoven fabric.

Examples of the woven fabric include, without limitation, glass cloth, aramid cloth, and polyester cloth.

Examples of the nonwoven fabric include, without limitation, glass nonwoven fabric, aramid nonwoven fabric, polyester nonwoven fabric, pulp paper, and linter paper.

Examples of the glass fiber as a constituent material for the glass cloth and the glass nonwoven fabric include, without limitation, Q glass, NE glass, E glass, S glass, T glass, L glass, and L2 glass.

The base member 11 preferably has a thickness equal to or greater than 5 μm and equal to or less than 300 μm and more preferably has a thickness equal to or greater than 10 μm and equal to or less than 200 μm.

The surface of the base member 11 may be subjected to surface treatment with a silane coupling agent. The silane coupling agent may be, but does not have to be, a silane coupling agent having at least one functional group selected from the group consisting of, for example, a vinyl group, an epoxy group, a styryl group, a methacrylic group, an acrylic group, an amino group, an isocyanurate group, a ureido group, a mercapto group, an isocyanate group, and an acid anhydride group.

Figure 3:
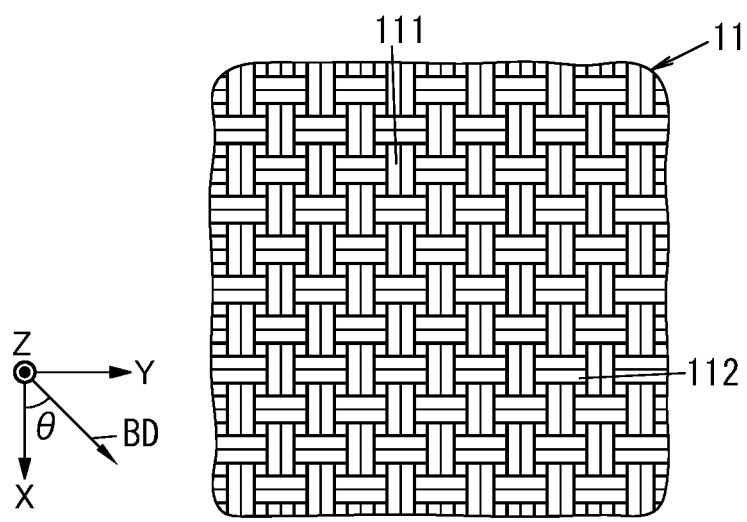
FIG. 3 is a schematic plan view illustrating a base member for use in the prepreg.

FIG. 3 illustrates an exemplary base member 11. The base member 11 is a piece of woven fabric in which a warp 111 and a woof 112 are woven. The direction (X direction) of the warp 111 and the direction (Y direction) of the woof 112 intersect with each other at right angles. The base member 11 extends in the X direction and the Y direction. A biasing direction BD is a direction intersecting with the direction (X direction) of the warp 111. The angle formed between the biasing direction BD and the direction (X direction) of the warp 111 is θ (which may be 45 degrees, for example).

The resin layer 10 may be either a resin layer containing a resin composition (in a first case) or a resin layer containing a semi-cured product of the resin composition (in a second case).

In the first case, the resin layer 10 may be formed in the following manner. Specifically, the resin layer 10 may be formed by impregnating a varnish of the resin composition into the base member 11 and then vaporizing the solvent. This resin layer 10 is formed as an unreacted resin composition (which is a dried product thereof). As used herein, the "unreacted state" includes a completely unreacted state and a hardly unreacted state. When heated, the resin layer 10 turns from the unreacted state into a cured state.

On the other hand, in the second case, the resin composition is in a semi-cured state. As used herein, the "semi-cured state" refers to an intermediate stage (Stage B) of a curing reaction. The intermediate stage is a stage between Stage A in the state of a varnish and Stage C in a fully cured state. In the second case, the resin layer 10 may be formed in the following manner. Specifically, the resin layer 10 may be formed by impregnating the base member 11 with a varnish of the resin composition, heating the base member 11 to vaporize the solvent, and advancing the curing reaction of the resin composition to the intermediate stage. This resin layer 10 is made of the resin composition in the semi-cured state (i.e., a semi-cured product of the resin composition).

As can be seen from the foregoing description, the degree of advancement of the curing reaction of the resin layer 10 varies according to the resin composition to use.

The thickness (i.e., thickness measured in the Z direction) of the prepreg 1 may be, but does not have to be, equal to or greater than 10 μm and equal to or less than 120 μm. This may achieve the advantage of reducing the thickness of the board.

As can be seen, the resin layer 10 of the prepreg 1 according to this embodiment is made of the resin composition described above, thus enabling manufacturing a board while reducing its warpage.

(3) Film with Resin

Figure 4A:
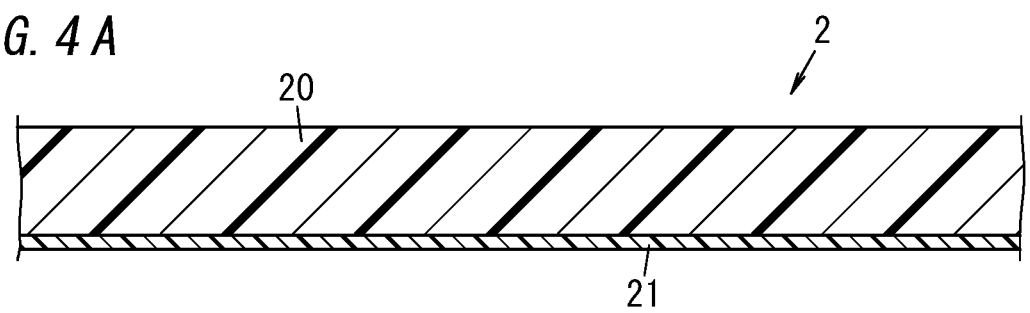
FIG. 4A is a schematic cross-sectional view illustrating a film with resin (and without a protective film) according to the exemplary embodiment of the present disclosure.

FIG. 4A illustrates a film 2 with resin according to this embodiment. The film 2 with resin has the shape of a film or sheet as a whole. The film 2 with resin includes: a resin layer 20 containing the resin composition or a semi-cured product of the resin composition; and a supporting film 21 that supports the resin layer 20. The film 2 with resin may be used, for example, to form a printed wiring board 5 with multiple levels (by buildup process).

Figure 6:
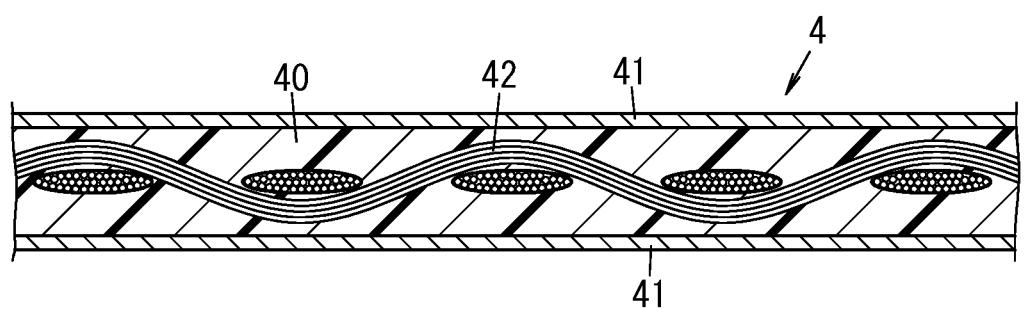
FIG. 6 is a schematic cross-sectional view illustrating a metal-clad laminate according to the exemplary embodiment of the present disclosure.
Figure 7A:
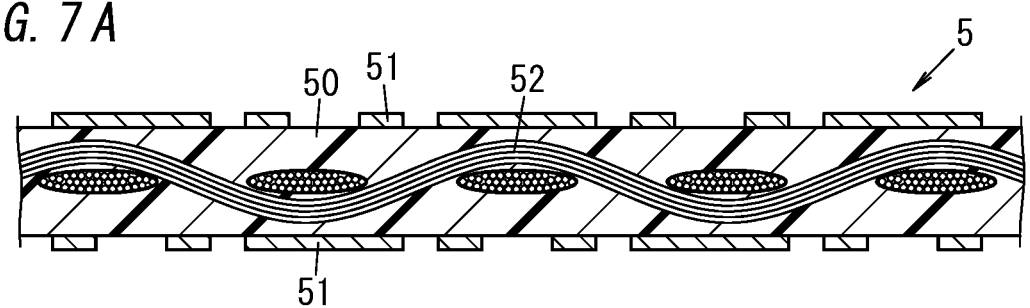
FIG. 7A is a schematic cross-sectional view illustrating a printed wiring board (without interlevel connection) according to the exemplary embodiment of the present disclosure.
Figure 7B:
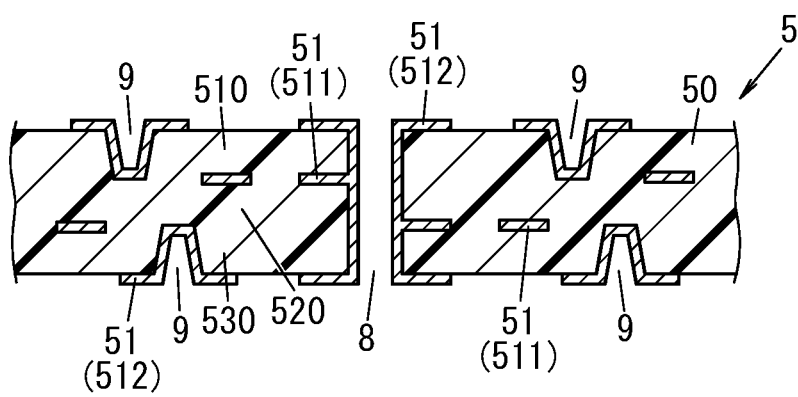
FIG. 7B is a schematic cross-sectional view illustrating a printed wiring board (with interlevel connection) according to the exemplary embodiment of the present disclosure.

When heated or irradiated with light (e.g., an ultraviolet ray), the resin layer 20 is cured to form the insulating layer 40 of the metal-clad laminate 4 or the insulating layer 50 of the printed wiring board 5 (refer to FIGS. 6-7B). The resin layer 20 is the same as the resin layer 10 of the prepreg 1 except that the resin layer 20 is not impregnated into the base member 11.

The thickness of the resin layer 20 is not limited to any particular value but may be, for example, equal to or greater than 10 μm and equal to or less than 120 μm. This enables reducing the thickness of the board.

The supporting film 21 supports the resin layer 20 thereon. Supporting the resin layer 20 in this way allows the resin layer 20 to be handled more easily. The supporting film 21 may be peeled off from the resin layer 20 as needed. After the resin layer 20 has been cured to form the insulating layer 40, the supporting film 21 is preferably peeled off from the insulating layer 40. The same statement applies to a situation where the insulating layer 50 is formed out of the resin layer 20.

The supporting film 21 may be, but does not have to be, an electrically insulating film, for example. Specific examples of the supporting film 21 include a polyethylene terephthalate (PET) film, a polyimide film, a polyester film, a polyparabanic acid film, a polyether ether ketone film, a polyphenylene sulfide film, an aramid film, a polycarbonate film, and a polyarylate film. However, these are only examples and the supporting film 21 does not have to be one of these films.

Figure 4B:
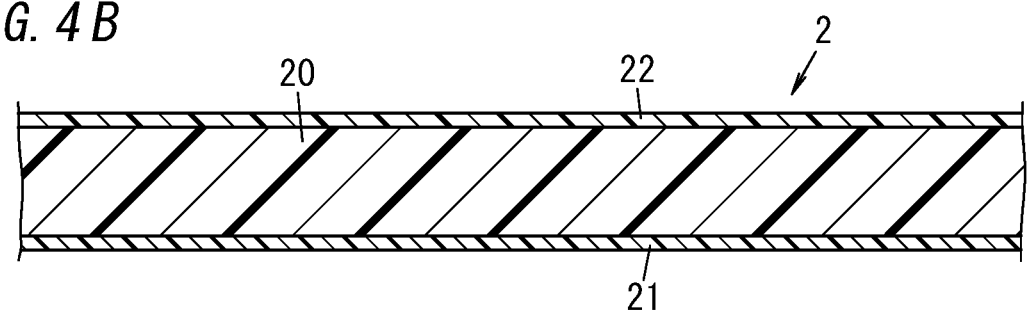
FIG. 4B is a schematic cross-sectional view illustrating a film with resin (and with a protective film) according to the exemplary embodiment of the present disclosure.

Although one surface of the resin layer 20 is covered with the supporting film 21 in the example shown in FIG. 4A, the other surface of the resin layer 20 may be covered with a protective film 22 with the one surface of the resin layer 20 covered with the supporting film 21 as shown in FIG. 4B. The protective film 22, as well as the supporting film 21, may also be peeled off from the resin layer 20 as needed. Covering both surfaces of the resin layer 20 in this manner allows the resin layer 20 to be handled even more easily. This also reduces the chances of foreign particles adhering onto the resin layer 20.

The protective film 22 may be, but does not have to be, an electrically insulating film, for example. Specific examples of the protective film 22 include a polyethylene terephthalate (PET) film, a polyolefin film, a polyester film, and a polymethylpentene film. However, these are only examples and the protective film 22 does not have to be one of these films.

As can be seen, the resin layer 20 of the film 2 with resin according to this embodiment is made of the resin composition described above, thus enabling manufacturing a board while reducing its warpage.

(4) Sheet of Metal Foil with Resin

Figure 5:
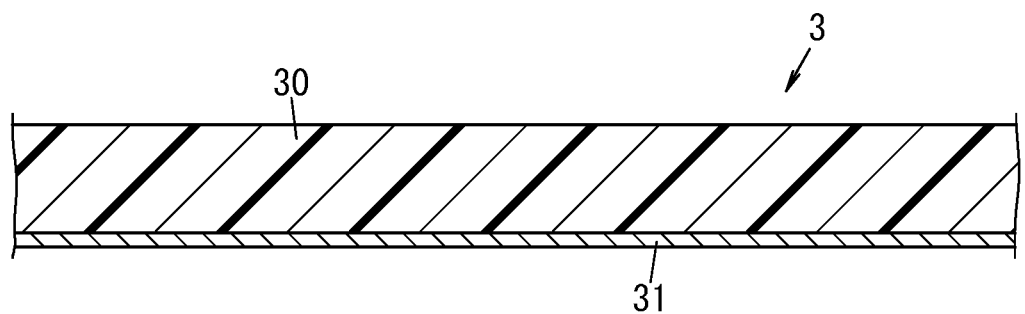
FIG. 5 is a schematic cross-sectional view illustrating a sheet of metal foil with resin according to the exemplary embodiment of the present disclosure.

FIG. 5 illustrates a sheet of metal foil 3 with resin according to this embodiment. The sheet of metal foil 3 with resin has the shape of a film or sheet as a whole. The sheet of metal foil 3 with resin includes: a resin layer 30 containing the resin composition or a semi-cured product of the resin composition; and a sheet of metal foil 31 bonded to the resin layer 30. The sheet of metal foil 3 with resin may be used, for example, to form a printed wiring board 5 with multiple levels (by buildup process).

When heated or irradiated with light (e.g., an ultraviolet ray), the resin layer 30 is cured to form the insulating layer 40 of the metal-clad laminate 4 or the insulating layer 50 of the printed wiring board 5 (refer to FIGS. 6-7B). The resin layer 30 is the same as the resin layer 10 of the prepreg 1 except that the resin layer 30 is not impregnated into the base member 11.

The thickness of the resin layer 30 is not limited to any particular value but may be, for example, equal to or greater than 10 μm and equal to or less than 120 μm. This enables reducing the thickness of the board.

The sheet of metal foil 31 is bonded onto the resin layer 30. The sheet of metal foil 31 may specifically be, but does not have to be, a sheet of copper foil, a sheet of aluminum foil, or a sheet of nickel foil. The sheet of metal foil 31 may be patterned into conductor wiring 51 by having unnecessary portions thereof etched away by subtractive process, for example (refer to FIG. 7A, for example).

The thickness of the sheet of metal foil 31 is not limited to any particular value but is preferably equal to or greater than 0.2 μm and equal to or less than 35 μm.

If the sheet of metal foil 31 is configured as an extremely thin sheet of metal foil, then the sheet of metal foil 31 preferably forms part of an extremely thin sheet of metal foil with a carrier from the viewpoint of improving its handleability. The extremely thin sheet of metal foil with the carrier includes the sheet of metal foil 31 (extremely thin sheet of metal foil), a peelable layer, and a carrier. In that case, the sheet of metal foil 31 has a thickness equal to or less than 10 μm, for example. The peelable layer is used to temporarily bond the sheet of metal foil 31 to the carrier. The sheet of metal foil 31 is peeled off as needed from either the peelable layer or the carrier. The carrier is a support for supporting the sheet of metal foil 31 thereon. Specific examples of the carrier include a sheet of copper foil and a sheet of aluminum foil. The carrier is thicker than the sheet of metal foil 31.

As can be seen, the resin layer 30 of the sheet of metal foil 3 with resin according to this embodiment is made of the resin composition described above, thus enabling manufacturing a board while reducing its warpage.

(5) Metal-Clad Laminate

FIG. 6 illustrates a metal-clad laminate 4 according to this embodiment. The metal-clad laminate 4 includes an insulating layer 40 and a metal layer 41 bonded to the insulating layer 40. The insulating layer 40 includes either a cured product of the resin composition or a cured product of the prepreg 1. The metal-clad laminate 4 may be used, for example, as a material for the printed wiring board 5.

Although the single insulating layer 40 includes a single base member 42 in the example illustrated in FIG. 6, the single insulating layer 40 may include two or more base members 42.

The thickness of the insulating layer 40 is not limited to any particular value but may be, for example, equal to or greater than 10 μm and equal to or less than 120 μm. This enables reducing the thickness of the board.

Although the metal layers 41 are respectively bonded to both surfaces of the insulating layer 40 in the example illustrated in FIG. 6, the metal layer 41 may be bonded to only one surface of the insulating layer 40. The metal-clad laminate 4 having the metal layers 41 respectively bonded to both surfaces of the insulating layer 40 is a double-sided metal-clad laminate. The metal-clad laminate 4 having the metal layer 41 bonded to only surface of the insulating layer 40 is a single-sided metal-clad laminate.

The metal layer 41 may be, but does not have to be, a sheet of metal foil, for example. The sheet of metal foil may be, but does not have to be, a sheet of copper foil, a sheet of aluminum foil, or a sheet of nickel foil, for example.

The thickness of the metal layer 41 is not limited to any particular value but may be, for example, equal to or greater than 0.2 μm and equal to or less than 35 μm. If the metal layer 41 is configured as an extremely thin sheet of metal foil, then the metal layer 41 preferably forms part of an extremely thin sheet of metal foil with a carrier from the viewpoint of improving its handleability. The extremely thin sheet of metal foil with a carrier is as described above.

As can be seen, the insulating layer 40 of the metal-clad laminate 4 according to this embodiment is made of the resin composition described above, thus enabling manufacturing a board while reducing its warpage.

(6) Printed Wiring Board

FIGS. 7A and 7B illustrate printed wiring boards 5 according to this embodiment. Each of the printed wiring boards 5 includes an insulating layer 50 and conductor wiring 51 formed on the insulating layer 50. The insulating layer 50 includes either a cured product of the resin composition or a cured product of the prepreg 1.

The printed wiring board 5 shown in FIG. 7A includes a single insulating layer 50. In FIG. 7A, the single insulating layer 50 includes a single base member 52. However, this is only an example and should not be construed as limiting. Alternatively, the single insulating layer 50 may include two or more base members 52. On the other hand, the printed wiring board 5 shown in FIG. 7B includes a plurality of (specifically, three) insulating layers 50, namely, a first insulating layer 510, a second insulating layer 520, and a third insulating layer 530. These three insulating layers 50 are stacked in this order one on top of another in the thickness direction and are bonded to each other. In FIG. 7B, each of the first insulating layer 510, the second insulating layer 520 and the third insulating layer 530 may include no base member 52 or include one or more base members 52. As can be seen, the insulating layer 50 is the same as the insulating layer 40 of the metal-clad laminate 4 described above.

In the printed wiring board 5 shown in FIG. 7A, the conductor wiring 51 is formed on each of the two surfaces of the insulating layer 50. Alternatively, the conductor wiring 51 may be formed on only one surface of the insulating layer 50.

On the other hand, in the printed wiring board 5 shown in FIG. 7B, the conductor wiring 51 includes an internal circuit 511 and an external circuit 512. The internal circuit 511 is located between two insulating layers 50. Specifically, the internal circuit 511 is located between the first insulating layer 510 and the second insulating layer 520 and between the second insulating layer 520 and the third insulating layer 530. The external circuit 512 is located outside of the insulating layer 50. That is to say, the external circuit 512 is formed on the surface of the first insulating layer 510 and on the surface of the third insulating layer 530. The printed wiring board 5 shown in FIG. 7B further includes a via hole 8 and blind via holes 9. The via hole 8 and the blind via holes 8 electrically connect the internal circuit 511 and the external circuit 512 to each other. That is to say, the internal circuit 511 and the external circuit 512 are interconnected via the via hole 8 and the blind via holes 9.

The conductor wiring 51 may be, but does not have to be, formed by, for example, subtractive process or semi-additive process (SAP).

As can be seen, the insulating layer 50 of the printed wiring board 5 according to this embodiment is made of the resin composition described above, thus enabling manufacturing a board while reducing its warpage.

(7) Semiconductor Package

Figure 8:
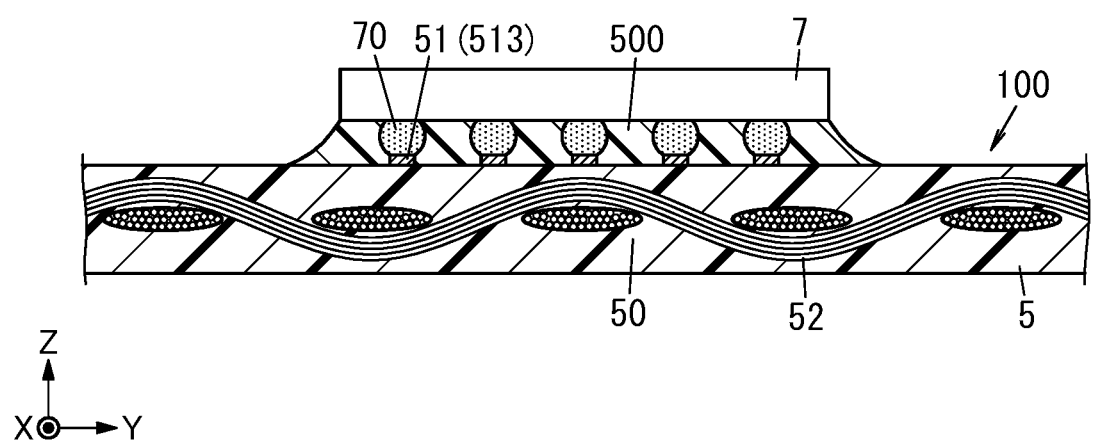
FIG. 8 is a schematic cross-sectional view illustrating a semiconductor package according to the exemplary embodiment of the present disclosure.

FIG. 8 illustrates a semiconductor package 100 according to this embodiment. The semiconductor package 100 includes the printed wiring board 5 and a semiconductor chip 7 mounted on the printed wiring board 5. In this case, the printed wiring board 5 is also called a "package board," a "module board," or an "interposer." The printed wiring board 5 includes at least one insulating layer 50. The insulating layer 50 includes at least one base member 52. Optionally, the insulating layer 50 may include no base member 52.

The insulating layer 50 includes the conductor wiring 51. The conductor wiring 51 includes pads 513. The pads 513 are formed on the surface of the insulating layer 50.

The semiconductor chip 7 is not limited to any particular one. The semiconductor chip 7 includes bumps 70. The bumps 70 are coupled to the pads 513. This allows the semiconductor chip 7 and the printed wiring board 5 to be electrically connected to each other.

An underfilling resin layer 500 is formed between the semiconductor chip 7 and the printed wiring board 5. The underfilling resin layer 500 is formed by filling the gap between the semiconductor chip 7 and the printed wiring board 5 with an underfilling liquid encapsulant and curing the encapsulant.

As can be seen, the semiconductor package 100 according to this embodiment includes the printed wiring board 5, and therefore, may have its warpage reduced.

Examples

Next, the present disclosure will be described specifically by way of specific examples. Note that the examples to be described below are only examples of the present disclosure and should not be construed as limiting.

(1) Resin Composition

Materials for the resin composition are as follows:
<Curable Resin>
<<Long-Chain-Containing Compound (A1)>>
 A maleimide compound (A5) expressed by the formula (a5), product name "BMI-689" manufactured by Designer Molecules Inc. (DMI), having a maleimide group equivalent of 345 g/ep;
 A maleimide compound (A4) expressed by the formula (a4), product name "BMI-1500" manufactured by Designer Molecules Inc. (DMI), having a maleimide group equivalent of 750 g/ep;
 A maleimide compound (A3) expressed by the formula (a3), product name "BMI-3000" manufactured by Designer Molecules Inc. (DMI), having a maleimide group equivalent of 1500 g/ep;

<<No-Long-Chain-Containing Compound (A2)>>
 A maleimide compound (A7) expressed by the formula (a7), product name "BMI-5100" manufactured by Daiwa Kasei Industry Co., Ltd., having a maleimide group equivalent of 221 g/ep;
<<Resin Component (B)>>
[Epoxy Compound]
 Dicyclopentadiene epoxy resin, product name "HP-7200" manufactured by DIC Corporation, having an epoxy equivalent of 254-264 g/eq;
 Naphthalene epoxy resin, product name "HP-9500" manufactured by DIC Corporation, having an epoxy equivalent of 230 g/eq;
[Phenolic Compound]
 Phenol novolac, product name "TD-2090" manufactured by DIC Corporation, having a hydroxyl equivalent of 105 g/eq;
<Styrene Copolymer (C)>
 Hydrogenated methylstyrene (ethylene/butylene) methylstyrene copolymer, hydrogenated styrene thermoplastic elastomer (SEBS), product name "Septon® V9827" manufactured by Kuraray Co., Ltd., having a weight average molecular weight of 92,000;
<Acrylic Resin>
 Acrylic resin, product name "KV-8161" manufactured by Shin-Nakamura Chemical Co., Ltd; <Inorganic filler (D)>
 Fused silica, product name "SC2050-MTX" manufactured by Admatechs, having a mean particle size of 0.5 μm; and
<Other Components (E)>
 2-ethyl-4-methylimidazole, "2E4MZ" manufactured by Shikoku Chemicals Corporation.

The long-chain-containing compound (A1), the no-long-chain-containing compound (A2), the resin component (B), the styrene copolymer (C), the inorganic filler (D), and the other components (E) were compounded together to have any of the compositions shown in the following Tables 1 and 2 and mixed with an appropriate solvent. The mixture was stirred up to be homogenized. In this manner, a varnish of the resin composition was prepared.

(2) Prepreg

A prepreg was produced by impregnating the varnish into a piece of glass cloth (#2116 type, WEA116E manufactured by Nitto Boseki Co., Ltd., E glass, having a thickness of 0.1 mm) and then heating and drying the glass cloth impregnated with the varnish for about two to eight minutes.

(3) Metal-Clad Laminate

Two sheets of such prepregs were stacked one on top of the other. The stack thus obtained was sandwiched between two sheets of copper foil, each having a thickness of 12 μm. Then, the assembly was heated to 220° C. under a pressure of 3 MPa for two hours. In this manner, a double-sided copper-clad laminate (as an exemplary double-sided metal-clad laminate) having a thickness of approximately 0.2 mm was manufactured. The following tests were conducted by using this as a board for evaluation.

(4) Tests (4.1) Loss Tangent (tan δ)

First, an unclad plate was obtained by etching away the sheet of copper foil from both sides of the board for evaluation. Next, the unclad plate was cut out into a strip with a width of 5 mm in a biasing direction forming a tilt angle of 45 degrees with respect to the warp direction of the base member, thereby obtaining a sample with a length of 25 mm. This sample was subjected to a dynamic mechanical analysis (DMA) using a dynamic mechanical spectrometer (DMS6100 manufactured by SII Nanotechnology Inc.) under the condition including a chucking interval of 10 mm, a temperature increase rate of 5° C./min, a frequency of 10 Hz, and a tensile mode adopted. By carrying out this measurement, the loss tangent (tan δ) was obtained as the minimum value within the range from 100° C. to 200° C.

Next, Max (B)/Max (A) was obtained based on the tan δ-temperature curve. In particular, tan δ-temperature curves of the first and third specific examples and the first, second, fourth, and fifth comparative examples are shown in FIG. 1.

(4.2) Warpage of Package

First, a semiconductor package (PKG) was fabricated to measure the warpage of the package (refer to FIG. 8). Specifically, unnecessary portions of the sheet of copper foil on one side of the board for evaluation (with dimensions of 12 mm×12 mm) were etched away to form conductor wiring (as pads). In addition, the sheet of copper foil on the other side of the board for evaluation was completely etched away. Meanwhile, a semiconductor chip with dimensions of 10 mm×10 mm×0.1 mm (thickness) was provided. The semiconductor chip had bumps.

Then, the bumps of the semiconductor chip were bonded onto the pads of the board for evaluation and the gap between the board for evaluation and the semiconductor chip was filled with an underfilling liquid encapsulant (product name "CV5300AM" manufactured by Panasonic Corporation), which was then cured. In this manner. a simple semiconductor package for use to measure the warpage of the package was fabricated.

Next, the warpage of the semiconductor package was measured by using a warpage measurement tool (model number "TherMoiré PS200" manufactured by Akrometrix Corporation) based on the shadow moiré measurement theory. Specifically, the warpage of the package was measured in the following manner. The semiconductor package was heated twice. For the first time, the semiconductor package was heated from 30° C. (starting temperature) to 260° C. and then was cooled to 30° C. (ending temperature). For the second time, the semiconductor package was also heated from 30° C. (starting temperature) to 260° C. and then was cooled to 30° C. (ending temperature). The warpage at 30° C. for the second time was defined to be the warpage of the package. Note that when the semiconductor package was heated for the second time, its warpage at the starting temperature was almost the same as its warpage at the ending temperature.

(4.3) Glass Transition Temperature (Tg)

First, an unclad plate was obtained by etching away the sheet of copper foil from both sides of the board for evaluation. Next, the glass transition temperature (Tg) of the unclad plate was measured using a viscoelasticity spectrometer (DMS100) manufactured by Seiko Instruments, Inc. At this time, a dynamic mechanical analysis (DMA) was carried out using a bending module with the frequency set at 10 Hz. The temperature at which the loss tangent (tan δ) reached a local maximum when the temperature was increased from room temperature to 320° C. at a temperature increase rate of 5° C./min was defined to be the glass transition temperature (Tg). Note that the glass transition temperature (Tg) higher than 300° C. is indicated by ">300" in Tables 1 and 2.

(4.3) Heat Resistance

A test piece having dimensions of 5 cm×5 cm was cut out of the board for evaluation and then loaded into a dryer at 290° C. for 1 hour. Thereafter, the test piece was unloaded from the dryer, observed with the naked eye, and graded as follows in terms of its heat resistance:

Grade A: if the test piece did not swell; or

Grade B: if the test piece swelled.

TABLE 1

| | | | | | | | | | Examples | | | | | |
|---|---|---|---|---|---|---|---|---|---|---|---|---|---|---|
| | | | | | 1 | 2 | 3 | 4 | 5 | 6 | 7 | 8 | 9 | 10 |
| Composition | Curable Resin | Long-chain-containing compound (A1) | BMI-689 | Parts by mass | 0 | 0 | 0 | 0 | 0 | 0 | 0 | 50 | 0 | 0 |
| | | | BMI-1500 | Parts by mass | 0 | 0 | 0 | 70 | 0 | 0 | 50 | 0 | 0 | 0 |
| | | | BMI-3000 | Parts by mass | 70 | 70 | 70 | 0 | 70 | 50 | 0 | 0 | 70 | 35 |
| | | No-long-chain-containing compound (A2) | BMI-5100 | Parts by mass | 0 | 0 | 0 | 0 | 0 | 0 | 0 | 0 | 20 | 0 |
| | | Resin component (B) | HP-7200 | Parts by mass | 0 | 0 | 0 | 0 | 30 | 0 | 0 | 0 | 0 | 0 |
| | | | HP-9500 | Parts by mass | 30 | 30 | 30 | 30 | 0 | 50 | 50 | 50 | 10 | 30 |
| | | | TD-2090 | Parts by mass | 0 | 0 | 0 | 0 | 0 | 0 | 0 | 0 | 0 | 0 |
| | Styrene copolymer (C) | | V9827 | Parts by mass | 0 | 0 | 0 | 0 | 0 | 0 | 0 | 0 | 0 | 35 |
| | Acrylic resin | | KV-8161 | Parts by mass | 0 | 0 | 0 | 0 | 0 | 0 | 0 | 0 | 0 | 0 |
| | Inorganic filler (D) | | SC2050-MTX | Parts by mass | 0 | 100 | 100 | 0 | 0 | 0 | 0 | 0 | 100 | 100 |
| | Other components (E) | | 2E4MZ | Parts by mass | 1 | 1 | 1 | 1 | 1 | 1 | 1 | 1 | 1 | 1 |
| Evaluation | tanδ (100-200° C. minimum) (Min) | | DMA | — | 0.13 | 0.08 | 0.05 | 0.12 | 0.08 | 0.09 | 0.09 | 0.09 | 0.08 | 0.08 |
| | Max(B)/Max(A) | | DMA | — | 0.9 | 0.3 | 0.3 | 0.6 | 0.7 | 0.3 | 0.4 | 0.4 | 0.8 | 0.5 |
| | PKG warpage (30° C.) | | Shadow moiré | μm | 120 | 135 | 200 | 130 | 125 | 150 | 160 | 170 | 125 | 120 |
| | Glass transition temperature (Tg) | | DMA | ° C. | 270 | 265 | 265 | 260 | 200 | 275 | 265 | 255 | 265 | 265 |
| | Heat resistance | | 290° C. 1 h | — | A | A | A | A | A | A | A | A | A | A |

TABLE 2

|  |  |  |  |  | Comparative examples | | | | |
|---|---|---|---|---|---|---|---|---|---|
|  |  |  |  |  | 1 | 2 | 3 | 4 | 5 |
| Composition | Curable Resin | Long-chain-containing compound (A1) | BMI-689 | Parts by mass | 0 | 0 | 0 | 0 | 0 |
|  |  |  | BMI-1500 | Parts by mass | 0 | 0 | 0 | 0 | 0 |
|  |  |  | BMI-3000 | Parts by mass | 0 | 0 | 0 | 0 | 0 |
|  |  | No-long-chain-containing compound (A2) | BMI-5100 | Parts by mass | 0 | 100 | 0 | 0 | 0 |
|  |  | Resin component (B) | HP-7200 | Parts by mass | 0 | 0 | 0 | 0 | 70 |
|  |  |  | HP-9500 | Parts by mass | 100 | 0 | 30 | 50 | 0 |
|  |  |  | TD-2090 | Parts by mass | 0 | 0 | 0 | 0 | 30 |
|  | Styrene copolymer (C) |  | V9827 | Parts by mass | 0 | 0 | 70 | 0 | 0 |
|  | Acrylic resin |  | KV-8161 | Parts by mass | 0 | 0 | 0 | 50 | 0 |
|  | Inorganic filler (D) |  | SC2050-MTX | Parts by mass | 0 | 0 | 100 | 100 | 100 |
|  | Other components (E) |  | 2E4MZ | Parts by mass | 1 | 1 | 1 | 1 | 1 |
| Evaluation | tanδ (100-200° C. minimum) (Min) |  | DMA | — | 0.02 | 0.01 | 0.03 | 0.02 | 0.02 |
|  | Max(B)/Max(A) |  | DMA | — | 0.1 | 0.6 | 0.8 | 0.3 | 1.1 |
|  | PKG warpage (30° C.) |  | Shadow moiré | μm | 350 | 300 | 130 | 160 | 350 |
|  | Glass transition temperature (Tg) |  | DMA | ° C. | 275 | >300 | 265 | 265 | 180 |
|  | Heat resistance |  | 290° C. 1 h | — | A | A | B | B | B |

REFERENCE SIGNS LIST

1 Prepreg
10 Resin Layer
11 Base Member
2 Film with Resin
20 Resin Layer
21 Supporting Film
3 Sheet of Metal Foil with Resin
30 Resin Layer
31 Sheet of Metal Foil
4 Metal-Clad Laminate
40 Insulating Layer
41 Metal Layer
5 Printed Wiring Board
50 Insulating Layer
51 Conductor Wiring

The invention claimed is:

1. A resin composition containing a curable resin,
a minimum value of loss tangent (tan δ=E"/E') of a cured product of the resin composition being equal to or greater than 0.04, the loss tangent being a ratio of a loss modulus (E") of the cured product of the resin composition to a storage modulus (E') thereof, the loss modulus (E"), the storage modulus (E'), and the loss tangent (tan δ=E"/E') being obtained by dynamic mechanical analysis at a temperature equal to or higher than 100° C. and equal to or lower than 200° C.,
wherein a ratio of Max (B) to Max (A) is less than one, where Max (B) is a maximum value of the loss tangent of the cured product as measured by the dynamic mechanical analysis at the temperature equal to or higher than 100° C. and equal to or lower than 200° C., and Max (A) is a maximum value of the loss tangent of the cured product as measured by the dynamic mechanical analysis at a temperature equal to or higher than 30° C. and lower than 100° C. and at a temperature higher than 200° C. and equal to or lower than 300° C.

2. The resin composition of claim 1,
wherein the curable resin includes a long-chain-containing compound, and
the long-chain-containing compound includes:
a long-chain hydrocarbon group having an alkyl group, of which a carbon number is equal to or greater than six, and/or an alkylene group, of which a carbon number is equal to or greater than six; and
a first functional group including at least one selected from the group consisting of an epoxy group, a maleimide group, an imide group, and a hydroxyl group.

3. The resin composition of claim 2, wherein
the curable resin further includes a no-long-chain-containing compound, and
the no-long-chain-containing compound includes no long-chain hydrocarbon group but includes a second functional group including at least one selected from the group consisting of the epoxy group, the maleimide group, the imide group, and the hydroxyl group.

4. The resin composition of claim 1, further containing a styrene copolymer.

5. A prepreg comprising:
a base member; and
a resin layer containing either the resin composition of claim 1 or a semi-cured product of the resin composition,
the resin composition or the semi-cured product of the resin composition being impregnated into the base member.

6. A film with resin, comprising:
a resin layer containing either the resin composition of claim 1 or a semi-cured product of the resin composition; and
a supporting film supporting the resin layer.

7. A sheet of metal foil with resin, comprising:
a resin layer containing either the resin composition of claim 1 or a semi-cured product of the resin composition; and
a sheet of metal foil bonded to the resin layer.

8. A metal-clad laminate comprising:
an insulating layer containing a cured product of the resin composition of claim 1; and
a metal layer bonded to the insulating layer.

9. A printed wiring board comprising:
an insulating layer containing a cured product of the resin composition of claim 1; and
conductor wiring formed on the insulating layer.

10. A resin composition containing a curable resin,
a minimum value of loss tangent (tan δ=E"/E') of a cured product of the resin composition being equal to or greater than 0.04, the loss tangent being a ratio of a loss modulus (E") of the cured product of the resin composition to a storage modulus (E') thereof, the loss modulus (E"), the storage modulus (E'), and the loss tangent (tan δ=E"/E') being obtained by dynamic mechanical analysis at a temperature equal to or higher than 100° C. and equal to or lower than 200° C., the curable resin including a long-chain-containing compound, the long-chain-containing compound including:
- a long-chain hydrocarbon group having an alkyl group, of which a carbon number is equal to or greater than six, and/or an alkylene group, of which a carbon number is equal to or greater than six; and
- a first functional group including at least one selected from the group consisting of an epoxy group, a maleimide group, an imide group, and a hydroxyl group.

11. The resin composition of claim 10, wherein the curable resin further includes a no-long-chain-containing compound, and the no-long-chain-containing compound includes no long-chain hydrocarbon group but includes a second functional group including at least one selected from the group consisting of the epoxy group, the maleimide group, the imide group, and the hydroxyl group.

12. The resin composition of claim 10, further containing a styrene copolymer.

13. A resin composition containing a curable resin and a styrene copolymer, a minimum value of loss tangent (tan δ=E"/E') of a cured product of the resin composition being equal to or greater than 0.04, the loss tangent being a ratio of a loss modulus (E") of the cured product of the resin composition to a storage modulus (E') thereof, the loss modulus (E"), the storage modulus (E'), and the loss tangent (tan δ=E"/E') being obtained by dynamic mechanical analysis at a temperature equal to or higher than 100° C. and equal to or lower than 200° C.

* * * * *